US012727286B2

(12) United States Patent
Li et al.

(10) Patent No.: US 12,727,286 B2

(45) Date of Patent: Sep. 1, 2026

(54) GROWTH METHOD AND STRUCTURE OF LED EPITAXY

(71) Applicant: Focus Lightings Tech (Suqian) Co., Ltd., Suqian (CN)

(72) Inventors: Guochang Li, Suqian (CN); Hao Chen, Suqian (CN); Zhijun Xu, Suqian (CN); Ganyang Xu, Suqian (CN); Han Jiang, Suqian (CN); Wenjun Wang, Suqian (CN)

(73) Assignee: FOCUS LIGHTINGS TECH (SUQIAN) CO., LTD., Suqian (CN)

( * ) Notice: Subject to any disclaimer, the term of this patent is extended or adjusted under 35 U.S.C. 154(b) by 447 days.

(21) Appl. No.: 18/265,128

(22) PCT Filed: Mar. 17, 2023

(86) PCT No.: PCT/CN2023/082203

§ 371 (c)(1),
(2) Date: Jun. 2, 2023

(87) PCT Pub. No.: WO2024/119662

PCT Pub. Date: Jun. 13, 2024

(65) Prior Publication Data

US 2024/0405159 A1 Dec. 5, 2024

(30) Foreign Application Priority Data

Dec. 8, 2022 (CN) ........................ 202211575506.6

(51) Int. Cl.
*H10H 20/815* (2025.01)
*C30B 25/16* (2006.01)
(Continued)

(52) U.S. Cl.
CPC ......... *H10H 20/815* (2025.01); *C30B 25/165* (2013.01); *C30B 25/183* (2013.01);
(Continued)

(58) Field of Classification Search
CPC .......... H10H 20/815; H10H 20/01335; H10H 20/812; H10H 20/8162; H10H 20/80;
(Continued)

(56) References Cited

U.S. PATENT DOCUMENTS 6,940,100 B2 * 9/2005 Tsujimura ............ H10H 20/825 257/98
2006/0154454 A1 7/2006 Jeon et al.
(Continued)

FOREIGN PATENT DOCUMENTS

KR 20050014345 A 2/2005
TW 201511328 A 3/2015

OTHER PUBLICATIONS

Light Emitting Diode and Method of Fabricating the Same; 2008. (Year: 2008).*
(Continued)

*Primary Examiner* — Nilufa Rahim

(74) *Attorney, Agent, or Firm* — HOWARD M COHN and Associates, LLC

(57) ABSTRACT

A growth method of LED epitaxy comprises: providing a layer of substrate, wherein the substrate is an $Al_2O_3$ substrate or an $Al_2O_3/SiO_2$ composite substrate; successively depositing and growing a SiC buffer layer and a u-GaN layer on the substrate; wherein the temperature used for depositing the SiC buffer layer is 650~1550 degrees; the gas used for depositing the SiC buffer layer is a silicon source gas and a carbon source gas, a flow rate of the silicon source gas is 1~1000 sccm, and a flow rate of the carbon source gas is 1~1000 sccm; a gas carrier gas used for depositing the SiC buffer layer has a flow rate of 10~500 slm; the SiC buffer layer is deposited at a pressure of 100~700 torr; the SiC buffer layer is deposited for a thickness of 10~1000 A.

10 Claims, 1 Drawing Sheet

(51) Int. Cl.
*C30B 25/18* (2006.01)
*C30B 29/36* (2006.01)
*C30B 29/40* (2006.01)
*H10H 20/01* (2025.01)
*H10H 20/812* (2025.01)
*H10H 20/816* (2025.01)

(52) U.S. Cl.
CPC ............ *C30B 29/36* (2013.01); *C30B 29/406* (2013.01); *H10H 20/01335* (2025.01); *H10H 20/812* (2025.01); *H10H 20/8162* (2025.01)

(58) Field of Classification Search
CPC .. H10H 20/825; C30B 25/165; C30B 25/183; C30B 29/36; C30B 29/406
See application file for complete search history.

(56) References Cited

U.S. PATENT DOCUMENTS

2013/0143396 A1* 6/2013 Sudarshan ........ H01L 21/02378 438/503
2021/0125826 A1* 4/2021 Myers-Ward ....... H10P 14/2904
2022/0328722 A1* 10/2022 Tseng ................... H10H 20/825
2023/0118623 A1* 4/2023 Li ......................... C30B 25/183 257/77
2024/0332364 A1* 10/2024 Nishiguchi ......... H01L 21/2015

OTHER PUBLICATIONS

International Search Report and Written Opinion of the ISA issued in PCT/CN2023/082203, mailed Jun. 26, 2023; ISA/CN.

* cited by examiner

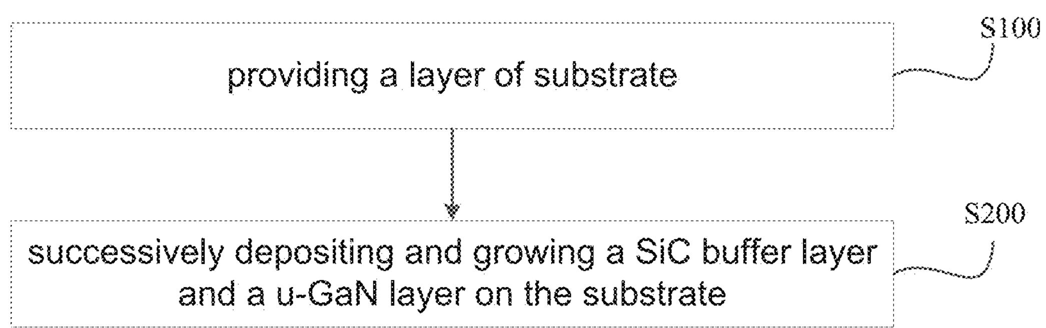
FIG.1
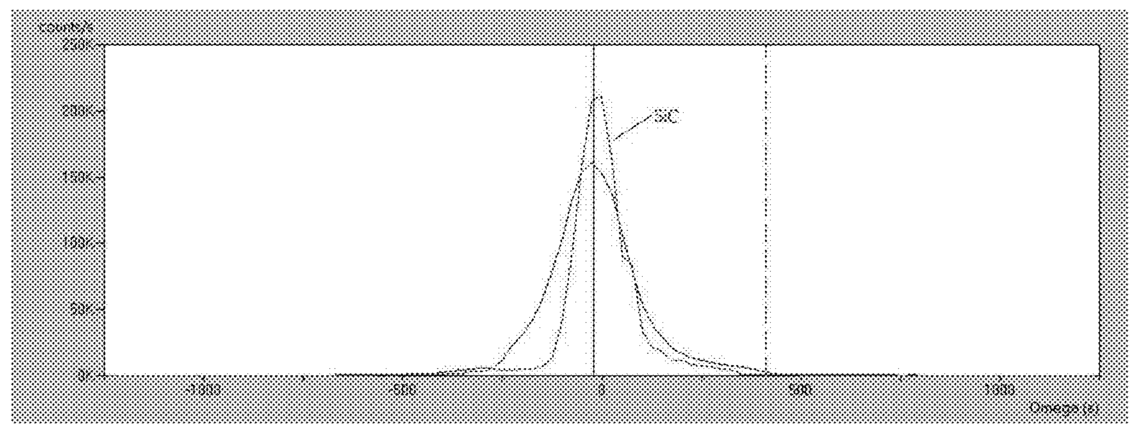
FIG.2
Metal contact layer PP
P-type gallium nitride p-GaN
Electron blocking layer EBL
Multiple quantum well light emitting layer
Stress release layer
N-type gallium nitride n-GaN
N-type gallium nitride n-GaN
SiC buffer layer
$Al_2O_3$ substrate
FIG.3

GROWTH METHOD AND STRUCTURE OF LED EPITAXY

The present application is a 371 U.S. National Phase of International Application No. PCT/CN2023/082203 filed on Mar. 17, 2023, which claims priority to Chinese Patent application Ser. No. 202211575506.6 entitled "Growth Method and Structure of LED Epitaxy" filed on Dec. 8, 2022, to the China National Intellectual Property Administration, the entire contents of which are incorporated herein by reference.

FIELD OF THE PRESENT DISCLOSURE

The present application relates to the technical field of light emitting diodes, and more particularly to a growth method and structure of LED epitaxy.

BACKGROUND OF THE PRESENT DISCLOSURE

A light emitting diode (LED) is a semiconductor electronic component capable of emitting light. As a new solid-state lighting source of high efficiency, environmental protection and green, LED is a promising light source of new generation, which is rapidly and widely used in such fields as traffic lights, interior and exterior lights of automobiles, urban landscape lighting, interior and exterior displays and small-distance displays.

In the relevant art, an LED epitaxial wafer is a semiconductor thin film grown on a single crystal material of a matched crystal structure, and the epitaxial wafer can be processed to form a chip, and the chip is a light emitting diode after being packaged. The conventional LED epitaxial wafer includes at least sapphire $Al_2O_3$ substrate and gallium nitride GaN layer grown on the substrate. Due to the existence of up to 13.8% lattice mismatch between $Al_2O_3$ and GaN layer, if the GaN layer is directly deposited on $Al_2O_3$, a large number of lattice mismatches and stresses, such as screw dislocations, edge dislocations, mixed dislocations, etc. will be generated, which seriously affect the efficiency of electron-hole recombination in the light emitting layer, and finally result in the low light emitting efficiency of LED.

For the above-mentioned reasons, it is desirable to provide a structure for reducing lattice mismatch between $Al_2O_3$ and GaN, thereby reducing lattice dislocation and stress between $Al_2O_3$ and GaN, so as to improve the light emitting efficiency of LED.

SUMMARY OF THE PRESENT DISCLOSURE

The present disclosure provides a growth method of LED epitaxy, the method comprising:

- providing a layer of substrate, wherein the substrate is an $Al_2O_3$ substrate or an $Al_2O_3/SiO_2$ composite substrate;
- successively depositing and growing a SiC buffer layer and a u-GaN layer on the substrate; wherein,
- the temperature used for depositing the SiC buffer layer is 650~1550 degrees;
- the gas used for depositing the SiC buffer layer is a silicon source gas and a carbon source gas, a flow rate of the silicon source gas is 1~1000 sccm, and a flow rate of the carbon source gas is 1~1000 sccm;
- a gas carrier gas used for depositing the SiC buffer layer has a flow rate of 10~500 slm;
- the SiC buffer layer is deposited at a pressure of 100~700 torr;
- the SiC buffer layer is deposited for a thickness of 10~1000 A.

In some embodiments, the SiC buffer layer is deposited at a temperature of 1000~1100 degrees.

In some embodiments, the silicon source gas is $SiH_4$; a flow rate of the silicon source gas is 100~200 sccm.

In some implementations, the carbon source gas is any one or a combination of more of $CH_4$, $C_2H_4$, $C_2H_6$, or $C_3H_8$; a flow rate of the carbon source gas is 100~200 sccm.

In some implementations, the gaseous carrier gas is $H_2$; a flow rate of the gaseous carrier gas is 50~100 slm.

In some implementations, the SiC buffer layer is deposited at a pressure of 400~600 torr.

In some implementations, the SiC buffer layer is deposited for a thickness of 100~200 A.

In some implementations, the growth method of LED epitaxy further comprises: successively growing an n-GaN layer, a stress release layer, a multiple quantum well light emitting layer, an electron blocking layer, a p-GaN layer and a metal contact layer on the u-GaN layer;

- the u-GaN layer being unintentionally doped GaN with a thickness of 1~5 μm;
- the n-GaN layer being Si-doped GaN with a thickness of 1~3 μm and a concentration of 1E18~5E19 atoms/$cm^3$;
- the stress release layer being an InGaN/GaN superlattice structure;
- the multiple quantum well light emitting layer being an InGaN/GaN/AlGaN superlattice structure.

The present disclosure also provides a structure of LED epitaxy applied to the aforementioned growth method of LED epitaxy, the structure of LED epitaxy comprising:

- a substrate, a SiC buffer layer and a u-GaN layer successively formed from bottom to top on the substrate, wherein the substrate is an $Al_2O_3$ substrate or an $Al_2O_3/SiO_2$ composite substrate.

In some implementations, the structure of LED epitaxy further comprises:

- an n-GaN layer, a stress release layer, a multiple quantum well light emitting layer, an electron blocking layer, a p-GaN layer and a metal contact layer which are successively formed from bottom to top on the u-GaN layer.

BRIEF DESCRIPTION OF THE DRAWINGS

In order to more clearly illustrate the embodiments of the present disclosure or the technical solutions in the prior art, a brief introduction will be given below for the accompanying drawings which are used as required in the description of the embodiments or the prior art.

FIG. 1 is a flow diagram of a growth method of LED epitaxy of the present disclosure according to some embodiments of the present disclosure;

FIG. 2 is a schematic diagram at half maximum height and full width of a SiC buffer layer of the present disclosure according to some embodiments of the present disclosure;

FIG. 3 is a schematic diagram of a structure of LED epitaxy of the present disclosure according to some embodiments of the present disclosure.

DESCRIPTION OF THE EMBODIMENTS

In order to facilitate an understanding of the technical solutions of the present disclosure, some concepts related to the present disclosure are firstly described below.

Warpage refers to the physical phenomenon that the processed layer is not shaped according to the designed shape, and surface distortion occurs, thereby resulting in uneven shrinkage of the shaped layer.

Lattice mismatch refers to mismatch due to differences in the lattice constants of the substrate and the epitaxial layer. When a single crystal layer of another substance is grown on a certain single crystal substrate, a stress adjacent to the growth interface is generated due to the difference in lattice constants of the two substances, thereby generating crystal defect and misfit mismatches.

Bond energy is the energy released when a chemical bond is formed or the energy absorbed when a chemical bond is broken and can be used to indicate the strength of a chemical bond.

Main group IV refers to the elements of the fourth main group in the periodic table, including five elements i.e., carbon, silicon, germanium, tin, lead and flerovium.

Superlattice structure refers to a multilayer film in which two different groups of elements are alternately grown in thin layers of several nanometers to several tens of nanometers and strictly maintained such period.

Heteroepitaxy is a physical term. It refers to that the thin film materials and substrate materials for epitaxial growth are different, or that the chemical composition or even physical structure of the grown epitaxial layer is completely different from that of the substrate, and the corresponding process is called heteroepitaxy.

Electron-blocking layer (EBL) refers to a thin film capable of controlling the flow of electrons in LED (blocking reverse leakage current) and improving the luminous efficiency.

Sapphire $Al_2O_3$ substrate is mostly used in LED substrate. $Al_2O_3$ substrate has the advantages of good chemical stability, non-absorption of visible light, moderate price and relatively mature manufacturing technology. Gallium nitride GaN can also be used directly as a substrate, and the dislocation density of GaN substrate is significantly lower than that of $Al_2O_3$ substrate. However, due to the high price of GaN and the difficulty of processing, it is not cost-effective. Therefore, using $Al_2O_3$ as a substrate and growing GaN thereon becomes a conventional means for LED epitaxial wafer processing operation. However, since the lattice mismatch ratio of $Al_2O_3$ to GaN is high, the light emitting efficiency of LED becomes lower.

For the above-mentioned reasons, the present disclosure proposes a method of disposing silicon carbide SiC as a buffer layer between $Al_2O_3$ and GaN.

As shown in FIG. 1, the present disclosure provides a growth method of LED epitaxy, comprising the following steps:

S100: A layer of substrate is provided.

The substrate is an $Al_2O_3$ substrate or a sapphire/silica $Al_2O_3/SiO_2$ composite substrate.

Exemplarily, the substrate is placed in a reaction chamber, which may be a reaction chamber of a metal-organic chemical vapor apparatus, such as a Veeoo K465i MOCVD or a Veeco C4 MOCVD.

In some embodiments, one hydrogen gas and nitrogen gas or a mixture thereof may be used as a carrier if other layers are grown on the substrate.

S200: A SiC buffer layer and a u-type gallium nitride u-GaN layer are sequentially deposited on the substrate.

During deposition of the SiC buffer layer, a temperature used for deposition is between 650~1500 degrees. Exemplarily, the temperature used for deposition is 650 degrees, 750 degrees, 850 degrees, 900 degrees, 950 degrees, 1000 degrees, 1050 degrees, 1100 degrees, 1150 degrees, 1200 degrees, 1250 degrees, 1300 degrees, 1350 degrees, 1400 degrees, 1450 degrees or 1500 degrees, and may be other temperature values of 650~1500 degrees not shown.

In some embodiments, the temperature used for deposition is 1000~1100 degrees. The temperature value of the deposition may be adjusted accordingly at different stages of the actual operation, and it should not be construed that a temperature must be maintained from the beginning to the end of the deposition of the SiC buffer layer, but the temperature may be adjusted within a reasonable temperature range, e.g., to a temperature range or value of 650~750 degrees, or 1000~1050 degrees.

In some embodiments, the function of SiC as a buffer layer is to transition and reduce the stress and dislocation between $Al_2O_3$ and u-GaN layer. If a higher temperature is selected, the quality of SiC buffer layer will be increased, and at the same time, the melting point of $Al_2O_3$ will be approached, and the material of $Al_2O_3$ will be damaged. In addition, it results in a lower film quality of the SiC if a lower temperature is selected to deposit the SiC buffer layer, thereby resulting in severe absorption. Thus, the temperature at which the SiC buffer layer is deposited is selected to be 650~1500 degrees, and in some embodiments, the temperature at which the SiC buffer layer is deposited is 1000~1100 degrees. At this temperature, not only the quality of the SiC buffer layer can be ensured, but also the absorption can be reduced.

The gases used to deposit the SiC buffer layer are a silicon source gas and a carbon source gas, wherein the silicon source gas has a flow rate of 1~1000 standard milliliters per minute sccm. Exemplarily, the silicon source gas has a flow rate of 1 sccm, 100 sccm, 300 sccm, 500 sccm, 700 sccm, 900 sccm, or 1000 sccm, and may be other flow rate values within 1~1000 sccm not shown.

The carbon source gas has a flow rate of 1~1000 sccm. Exemplarily, the carbon source gas has a flow rate of 1 sccm, 100 sccm, 300 sccm, 500 sccm, 700 sccm, 900 sccm, or 1000 sccm, and may be other flow rate values within 1~1000 sccm not shown.

In some embodiments, the silicon source gas may be silyl $SiH_4$.

$SiH_4$, as a gas source for providing a silicon component, can pass through the substrate surface at a high temperature of 650~1550 degrees and at 1~1000 sccm and deposit on the substrate surface to form a SiC buffer layer.

In order to better deposit the SiC buffer layer on the surface of the substrate, a flow rate of the silicon source gas may be 100~200 sccm. Exemplarily, the flow rate of the silicon source gas is 100 sccm, 110 sccm, 120 sccm, 130 sccm, 140 sccm, 150 sccm, 160 sccm, 170 sccm, 180 sccm, 190 sccm, or 200 sccm, and may be other flow rate values within 100~200 sccm not shown.

In some embodiments, the carbon source gas is any one of methane $CH_4$, ethylene $C_2H_4$, liquefied ethane $C_2H_6$, or propane $C_3H_8$, or a combination thereof.

Any one of $CH_4$, $C_2H_4$, $C_2H_6$ or $C_3H_8$, or a combination thereof constituting the carbon source gas, such as a combination of $CH_4$ and $C_2H_4$; a combination of $CH_4$ and $C_2H_6$, a combination of $CH_4$ and $C_3H_8$; a combination of $C_2H_4$, $CH_6$, and $C_3H_8$; a combination of $CH_4$, $C_2H_4$, and $C_3H_8$; a combination of $C_2H_4$, $C_2H_6$, and $C_3H_8$, and the like. The SiC buffer layer is formed at a high temperature of 650~1550 degrees by passing them through the substrate surface at 1~1000 sccm and depositing on the substrate surface.

For better deposition of the SiC buffer layer on the surface of the substrate, the flow rate of the carbon source gas may be 100~200 sccm. Exemplarily, the flow rate of the carbon source gas is 100 sccm, 110 sccm, 120 sccm, 130 sccm, 140 sccm, 150 sccm, 160 sccm, 170 sccm, 180 sccm, 190 sccm, or 200 sccm, and may be other flow rate values within 100~200 sccm not shown.

The SiC buffer layer is deposited using a gas carrier at a flow rate of 10~500 standard liters per minute sim. Exemplarily, the flow rate of the gas carrier used to deposit the SiC buffer layer is 10 sim, 50 sim, 100 sim, 150 sim, 200 sim, 250 sim, 300 sim, 350 sim, 400 sim, 450 sim, or 500 sim, and may be other flow rate values within 10~500 sim not shown.

In some embodiments, the gas carrier can be $H_2$ and the gaseous carrier gas has a flow rate that can range 50~100 sim. Exemplarily, the gaseous carrier gas has a flow rate of 50 sim, 55 slm, 60 sim, 65 sim, 70 sim, 75 sim, 80 sim, 85 sim, 90 sim, 95 sim, or 100 sim, and may be other flow rate values within 50~100 sim not shown.

The flow rate of the gas carrier can be adjusted within a small range, for example 75~80 sim, while ensuring the deposition effect. The silicon source gas and the carbon source gas can be flowed and deposited on the surface of the substrate using a gas carrier.

the SiC buffer layer is deposited at a pressure of 100~700 torr. Exemplarily, the SiC buffer layer is deposited at a pressure of 100 torr, 200 torr, 300 torr, 400 torr, 500 torr, 600 torr, or 700 torr, and may be other pressures within 100~700 torr not shown.

In some embodiments, the SiC buffer layer is deposited at a pressure of 400~600 torr. Exemplarily, the SiC buffer layer is deposited to a pressure of 400 torr, 420 torr, 450 torr, 470 torr, 500 torr, 530 torr, 550 torr, 580 torr, or 600 torr. The SiC buffer layer formed at deposition pressure of 100~700 torr ensures the molecular concentration of SiC, improves the stability of SiC buffer layer and the strength of SiC buffer layer.

In some embodiments, the SiC buffer layer can be deposited by introducing the silicon source gas and a carbon source gas into a reaction tank under a condition of vacuum and high temperature, depositing the silicon source gas and the carbon source gas on the surface of the substrate at a certain flow rate, increasing the concentration of SiC molecules by the deposition pressure, reducing gaps between molecules, avoiding warping of the SiC buffer layer, and providing a basis for subsequent processes.

The SiC buffer layer is deposited for a thickness of 10~1000 Angstroms A. Exemplarily, the SiC buffer layer is deposited for a thickness of 10 A, 100 A, 200 A, 300 A, 400 A, 500 A, 600 A, 700 A, 800 A, 900 A, or 1000 A, or may be other deposition thicknesses within 10~1000 A not shown.

In some embodiments, the SiC buffer layer is deposited for a thickness of 100~200 A. Exemplarily, the SiC buffer layer is deposited for a thickness of 100 A, 110 A, 120 A, 130 A, 140 A, 150 A, 160 A, 170 A, 180 A, 190 A, or 200 A.

In this example, SiC acts as a C and Si stable compound in the IV main group with a lattice structure consisting of two sublattices in a dense arrangement, the C atom and the Si atom are linked in the form of a covalent bond, each Si (or C) atom is bonded to the surrounding C (Si) atom by an oriented strong tetrahedral sp3 bond, and although the tetrahedral bond of SiC is strong, the stacking fault formation energy is low. Due to the different packing order of Si—C double atomic layers, SiC has various crystal structures, and the common polytypes are cubic close packed 3C-SiC and hexagonal close packed 4H-SiC and 6H-SiC. Different polytypes have different electrical and optical properties.

As shown in FIG. 2, among all the crystalline forms of SiC, 3C-SiC bond has the lowest bond energy, the highest free energy of lattice and is easy to nucleate, but 3C-SiC is in a metastable state with low stability and being easy to undergo solid phase transfer. Under the condition that the 3C-SiC is close to the equilibrium state, when the annealing temperature is 1000 degrees and 1100 degrees high temperature respectively, the 3C-SiC will have phase transformation and partially be transformed into 6H-SiC and 4H-SiC, in which the bond energies of the three crystalline forms are in the order of 3C-SiC<6H-SiC<4H-SiC. The smaller the bond energy is, the more unstable it is, and the easier the phase transformation will occur under the influence of external conditions. Thus, by changing external conditions such as temperature, gas flow rate, and deposition pressure, 3C-SiC can undergo a phase transition to other crystalline forms. In FIG. 2, the full width at half maximum height of the GaN peak is reduced due to the addition of the SiC buffer layer compared to the full width at half maximum height of the GaN peak without the SiC buffer layer or with a general buffer layer, since the introduction of SiC effectively alleviates the lattice mismatch and thermal mismatch of GaN and $Al_2O_3$, and the SiC buffer layer improves the crystalline quality of GaN. Since the thermal conductivity of SiC is much higher than that of GaN and $Al_2O_3$, the lattice mismatch of SiC with GaN and $Al_2O_3$ is further reduced.

In some embodiments, the growth mechanism of the u-GaN layer is mainly island-like growth, i.e., the small islands with slightly different crystal directions polymerize with each other through diffusion. When the stress is concentrated at the vacancies formed at the sites where the islands merge, defects such as dislocations easily occur. When the epitaxial u-GaN layer is grown heteroepitaxially, internal stress is generated due to lattice mismatch, and thus causes defects such as dislocations, resulting in the decrease of the crystal quality of the u-GaN layer. In this case, the introduction of the SiC buffer layer effectively alleviates the lattice mismatch and reduces the internal stress, thereby reducing the dislocation density and improving the crystal quality of the u-GaN layer. In this way, the SiC buffer layer located between $Al_2O_3$ and u-GaN can effectively reduce the lattice mismatch and improve the luminous efficiency of LED.

In addition, the price of SiC is between $Al_2O_3$ and GaN, and if SiC is used as a substrate, production costs are increased when growing GaN on a SiC substrate. Therefore, by growing a SiC buffer layer between $Al_2O_3$ and GaN, the problem of lattice mismatch between $Al_2O_3$ and GaN can be reduced. The lattice mismatch rate between SiC and GaN can be 3.5%, which is much lower than 13.8%, that between $Al_2O_3$ and GaN. The dislocation defects caused by lattice mismatch can be greatly reduced, and the electron-hole recombination efficiency and the light emitting efficiency of LED can be improved, and the production cost can also be reduced.

In some embodiments, the growth method of LED epitaxy further comprises sequentially growing an n-type gallium nitride n-GaN layer, a stress release layer, a multiple quantum well light emitting layer, an electron blocking layer, a p-type gallium nitride p-GaN layer, and a metal contact layer on the u-GaN layer.

In some embodiments, the u-GaN layer is an unintentionally doped GaN with a thickness of 1~5 μm. Exemplarily, the thickness of the unintentionally doped GaN is 1 μm, 1.5

μm, 2 μm, 2.5 μm, 3 μm, 3.5 μm, 4 μm, 4.5 μm, or 5 μm. The unintentional doping of GaN can reduce the impurities in the growth plane formed, which is facilitated to improve the growth quality of the stress release layer and thus improve the light emitting efficiency of LED.

The n-GaN layer is Si-doped GaN and has a thickness of 1~3 μm, and exemplarily the Si-doped GaN has a thickness of 1 μm, 1.5 μm, 2 μm, 2.5 μm or 3 μm.

The n-GaN layer is Si doped with a GaN concentration of 1E18~5E19 atomic weight per cubic centimeter, atoms/$cm^3$.

The stress release layer is an indium gallium nitride/gallium nitride InGaN/GaN superlattice structure. The stress release layer is grown between the n-GaN layer and the multiple quantum well light emitting layer, which can reduce the stress accumulated during the growth of the multiple quantum well light emitting layer, play a role in releasing the stress of the bottom layer, and reducing the lattice defects in the multiple quantum well light emitting layer due to excessive stress, thereby increasing the radiative recombination efficiency of electrons and holes in the multiple quantum well light emitting layer.

The multiple quantum well light emitting layer is an indium gallium nitride/gallium nitride/aluminum gallium nitride InGaN/GaN/AlGaN super lattice structure.

The electron blocking layer can avoid the transition of electrons to the metal contact layer, which facilitates the recombination of electrons and holes in the multiple quantum well light emitting layer and improves the light emitting efficiency of LED.

The p-GaN layer is grown on the electron-blocking layer and can be composed of a p-GaN layer and a magnesium-doped p-type GaN layer, which can improve the effective light extraction rate.

The metal contact layer, i.e., the P-type ohmic contact layer, further improves the light emitting efficiency of the LED by making the current spreading more uniform using an ohmic contact.

In the growth method of LED epitaxy of the present disclosure, a layer of SiC is interposed as a buffer layer between the substrate and the u-GaN layer, so as to reduce the lattice mismatch between the $Al_2O_3$ substrate or the $Al_2O_3/SiO_2$ composite substrate and the GaN, and improve the light emitting efficiency of the quantum well. For example, using SiC as a buffer layer, a lattice mismatch of 13.8% between the $Al_2O_3$ substrate and the u-GaN layer can be reduced to a lattice mismatch of 3.5%, which greatly reduces dislocation defects caused by the lattice mismatch, such as screw-type dislocations, edge-type dislocations, mixed dislocations, etc. and improves electron-hole recombination efficiency and light emitting efficiency of LED.

Corresponding to the above-mentioned embodiments of the growth method of LED epitaxy, the present disclosure provides a structure of LED epitaxy applied to the aforementioned growth method of LED epitaxy, the structure of LED epitaxy comprising:

- a substrate, a SiC buffer layer and a u-GaN layer successively formed from bottom to top on the substrate, wherein the substrate is an $Al_2O_3$ substrate or an $Al_2O_2/SiO_2$ composite substrate.

Here, the substrate, the SiC buffer layer, and the u-GaN layer have been described in the growth method of LED epitaxy and will not be described in detail.

As shown in FIG. 3, in one embodiment, the structure of LED epitaxy further comprises an n-GaN layer, a stress release layer, a multiple quantum well light emitting layer, an electron blocking layer (EBL), a p-GaN layer and a metal contact layer (PP) which are successively formed from bottom to top on the u-GaN layer.

Finally, it should be noted that the above-mentioned embodiments are merely illustrative, but not restrictive, for the technical solution of the present disclosure. Although the present disclosure has been described in detail with reference to the foregoing embodiments, those skilled in the art will appreciate that the technical solutions disclosed in the above-mentioned embodiments can still be amended, or some or all of the technical features thereof can be replaced with equivalents. Such modifications and substitutions do not depart the substance of the corresponding technical solution from the scope of the technical solutions of the embodiments of the present disclosure.

What is claimed is:

1. A growth method of LED epitaxy, comprising:

providing a layer of substrate, wherein the substrate is an $Al_2O_3$ substrate or an $Al_2O_3/SiO_2$ composite substrate;

successively depositing and growing a SiC buffer layer and a u-GaN layer on the substrate; wherein:

the temperature used for depositing the SiC buffer layer is 650~1550 degrees;

the gas used for depositing the SiC buffer layer is a silicon source gas and a carbon source gas, a flow rate of the silicon source gas is 1~1000 sccm, and a flow rate of the carbon source gas is 1~1000 sccm;

a gaseous carrier gas used for depositing the SiC buffer layer has a flow rate of 10~500 slm;

the SiC buffer layer is deposited at a pressure of 100~700 torr;

the SiC buffer layer is deposited for a thickness of 10~1000 A.

2. The growth method of LED epitaxy according to claim 1, characterized in that the SiC buffer layer is deposited at a temperature of 1000~1100 degrees.

3. The growth method of LED epitaxy according to claim 1, characterized in that the silicon source gas is $SiH_4$; a flow rate of the silicon source gas is 100~200 sccm.

4. The growth method of LED epitaxy according to claim 1, characterized in that the carbon source gas is any one of $CH_4$, $C_2H_4$, $C_2H_6$, or $C_3H_8$, or a combination thereof; a flow rate of the carbon source gas is 100~200 sccm.

5. The growth method of LED epitaxy according to claim 1, characterized in that the gaseous carrier gas is $H_2$; a flow rate of the gaseous carrier gas is 50~100 slm.

6. The growth method of LED epitaxy according to claim 1, characterized in that the SiC buffer layer is deposited at a pressure of 400~600 torr.

7. The growth method of LED epitaxy according to claim 1, characterized in that the SiC buffer layer is deposited for a thickness of 100~200 A.

8. The growth method of LED epitaxy according to claim 1, further comprising: successively growing an n-GaN layer, a stress release layer, a multiple quantum well light emitting layer, an electron blocking layer, a p-GaN layer and a metal contact layer on the u-GaN layer;

the u-GaN layer being unintentionally doped GaN with a thickness of 1~5 μm;

the n-GaN layer being Si-doped GaN with a thickness of 1~3 μm and a concentration of 1E18~5E19 atoms/$cm^3$;

the stress release layer being an InGaN/GaN superlattice structure;

the multiple quantum well light emitting layer being an InGaN/GaN/AlGaN superlattice structure.

9. A structure of LED epitaxy, which is obtained by the method of claim 1, comprising:

a substrate, a SiC buffer layer and a u-GaN layer successively formed from bottom to top on the substrate, wherein the substrate is an $Al_2O_3$ substrate or an $Al_2O_3/SiO_2$ composite substrate.

10. The structure of LED epitaxy according to claim 9, further comprising:

an n-GaN layer, a stress release layer, a multiple quantum well light emitting layer, an electron blocking layer, a p-GaN layer and a metal contact layer, which are successively formed from bottom to top on the u-GaN layer.

* * * * *